United States Patent
Glover et al.

(10) Patent No.: US 10,393,577 B2
(45) Date of Patent: Aug. 27, 2019

(54) LIGHT SENSOR SYSTEM FOR CORRECTING OR EQUALIZING COLOR SIGNALS BY REMOVING INFRARED COMPONET FROM COLOR SIGNALS AND METHOD FOR PROCESSING LIGHT SENSOR SIGNALS

(71) Applicant: ams AG, Unterpremstaetten (AT)

(72) Inventors: Kerry Glover, Rockwall, TX (US); David Mehrl, Plano, TX (US); Dan Jacobs, McKinney, TX (US)

(73) Assignee: ams AG, Unterpremstaetten (AT)

( * ) Notice: Subject to any disclaimer, the term of this patent is extended or adjusted under 35 U.S.C. 154(b) by 488 days.

(21) Appl. No.: 14/423,101

(22) PCT Filed: Aug. 21, 2013

(86) PCT No.: PCT/EP2013/067388
§ 371 (c)(1),
(2) Date: Feb. 20, 2015

(87) PCT Pub. No.: WO2014/029806
PCT Pub. Date: Feb. 27, 2014

(65) Prior Publication Data
US 2015/0219492 A1 Aug. 6, 2015

Related U.S. Application Data

(60) Provisional application No. 61/692,565, filed on Aug. 23, 2012.

(30) Foreign Application Priority Data

Aug. 27, 2012 (EP) ..................................... 12181880

(51) Int. Cl.
| | |
|---|---|
| G01J 1/42 | (2006.01) |
| H01L 27/146 | (2006.01) |
| G01J 5/60 | (2006.01) |
| G01J 1/02 | (2006.01) |
| G01J 1/44 | (2006.01) |

(52) U.S. Cl.
CPC ............ *G01J 1/4228* (2013.01); *G01J 1/0238* (2013.01); *G01J 1/44* (2013.01); *G01J 5/60* (2013.01); *H01L 27/14645* (2013.01); *G01J 2001/446* (2013.01)

(58) Field of Classification Search
CPC ...... G01J 1/0238; G01J 5/60; G01J 2001/446; H01L 27/14645
See application file for complete search history.

(56) References Cited

U.S. PATENT DOCUMENTS 6,768,564 B1 7/2004 Gann
8,274,051 B1 9/2012 Aswell et al.
(Continued)

FOREIGN PATENT DOCUMENTS

JP 2011209299 A 10/2011

*Primary Examiner* — Michael Jung
(74) *Attorney, Agent, or Firm* — Fish & Richardson P.C.

(57) ABSTRACT

Color light sensors are used to sense colored light and a full spectrum light in order to generate at least three color channel signals and a clear channel signal. An infrared component IR is calculated by summing up the color channel signals with individual weighting factors and subtracting a weighted clear channel signal.

9 Claims, 4 Drawing Sheets

(56) References Cited

U.S. PATENT DOCUMENTS

| | | | |
|---|---|---|---|
| 9,163,990 B2 | 10/2015 | Lianza et al. | |
| 2006/0023093 A1 | 10/2006 | Thielert | |
| 2006/0273355 A1* | 12/2006 | Han | H01L 27/14603 257/239 |
| 2008/0208385 A1* | 8/2008 | Sakamoto | C23C 16/4412 700/121 |
| 2008/0237453 A1 | 10/2008 | Chen et al. | |
| 2008/0278592 A1* | 11/2008 | Kuno | H04N 9/045 348/222.1 |
| 2008/0315104 A1* | 12/2008 | Nam | H01L 27/14603 250/370.08 |
| 2009/0237382 A1 | 9/2009 | Kunimori | |
| 2009/0273679 A1 | 11/2009 | Gere et al. | |
| 2010/0231770 A1 | 9/2010 | Honda et al. | |
| 2010/0282953 A1 | 11/2010 | Tam | |
| 2011/0063451 A1* | 3/2011 | Kamon | H04N 5/2353 348/164 |
| 2011/0285895 A1* | 11/2011 | Weng | H04N 9/045 348/340 |
| 2013/0002731 A1 | 1/2013 | Tam | |
| 2014/0307098 A1 | 10/2014 | Kang et al. | |
| 2015/0219492 A1 | 8/2015 | Glover et al. | |

* cited by examiner

LIGHT SENSOR SYSTEM FOR CORRECTING OR EQUALIZING COLOR SIGNALS BY REMOVING INFRARED COMPONET FROM COLOR SIGNALS AND METHOD FOR PROCESSING LIGHT SENSOR SIGNALS

BACKGROUND OF THE INVENTION

The invention relates to a light sensor system and to a method for processing light sensor signals.

Nowadays various electronic devices comprise displays or screens that can be used under various lighting environments. To determine an actual state of the lighting environment, light sensors can be used that evaluate the intensity of the light in the visible frequency spectrum, for example. However, in conventional light sensors, not only the visible light spectrum is sensed but also an infrared component.

For some applications, the infrared content is negligible and may be ignored, for example when sensing light that is emitted by an LED backlight. However, in applications that need to measure ambient light levels, the infrared component, for example of incandescent light and sunlight, may influence the intensity of light sensed by the light sensors. As a consequence, the accuracy of the measurement may be impaired. To this end, attempts are made to reduce the IR components within the sensed light, for example by infrared blocking filters.

SUMMARY OF THE INVENTION

The improved concept is based on the idea that an infrared component IR of light can be calculated from three color signals from light sensors with a defined frequency spectrum related to a respective single color, and a clear channel signal corresponding to a full spectrum light. The color channel signals may correspond to red, green, blue channels, to cyan, magenta, yellow channels or to other defined color spectrums. The calculated IR component may be used to improve the signal accuracy of the color channel signals and the clear channel signal. For example, the IR component is calculated according to the formula:

$$IR = C1 \cdot R + C2 \cdot G + C3 \cdot B - C4 \cdot C, \quad (1)$$

where C1, C2, C3 and C4 are positive weighting factors.

According to one embodiment, a light sensor system comprises light sensors to sense red light, green light, blue light and a full spectrum light in order to generate the red channel signal R, the green channel signal G, the blue channel signal B and the clear channel signal C and a processing circuit which is configured to calculate the infrared component IR according to the formula of equation (1).

The weighting factors C1, C2, C3 and C4 may all be set to 0.5. However, the weighting factors may be chosen to differ from 0.5, each in a specified range such as from 0.4 to 0.6. The exact values of the weighting factors C1, C2, C3 and C4 may be determined in a calibration process after fabrication or implementation of the light sensor system. However, choosing all of the weighting factors C1, C2, C3 and C4 being equal to 0.5 results in a simplified signal processing.

As mentioned above, the color channel signals may not only represent red, green, blue but also cyan, magenta, yellow, instead. If respective light sensors for sensing cyan colored light, magenta colored light, yellow colored light and a full spectrum light are used, the equation (1) may be adapted to the corresponding cyan channel signal, CY, magenta channel signal M, yellow channel signal Y and the clear channel signal C. For example, similar to equation (1), the infrared component IR can be calculated from the color channel signals CY, M, Y, C.

According to an embodiment of a method for processing light sensor signals, the red channel signal R, the green channel signal G, the blue channel signal B and the clear channel signal C are received from a light sensor, corresponding to sensed red light, green light, blue light and a full spectrum light, respectively. An infrared component IR is calculated according to equation (1).

Further embodiments of the method become apparent from the various embodiments described below for the light sensor system.

The text below explains the invention in detail using exemplary embodiments with reference to the drawings. Components, signals and circuit elements that are functionally identical or have an identical effect bear identical reference numbers. In so far as circuit parts or components correspond to one or another function, a description of them will not be repeated in each of the following figures.

DETAILED DESCRIPTION

Figure 1:
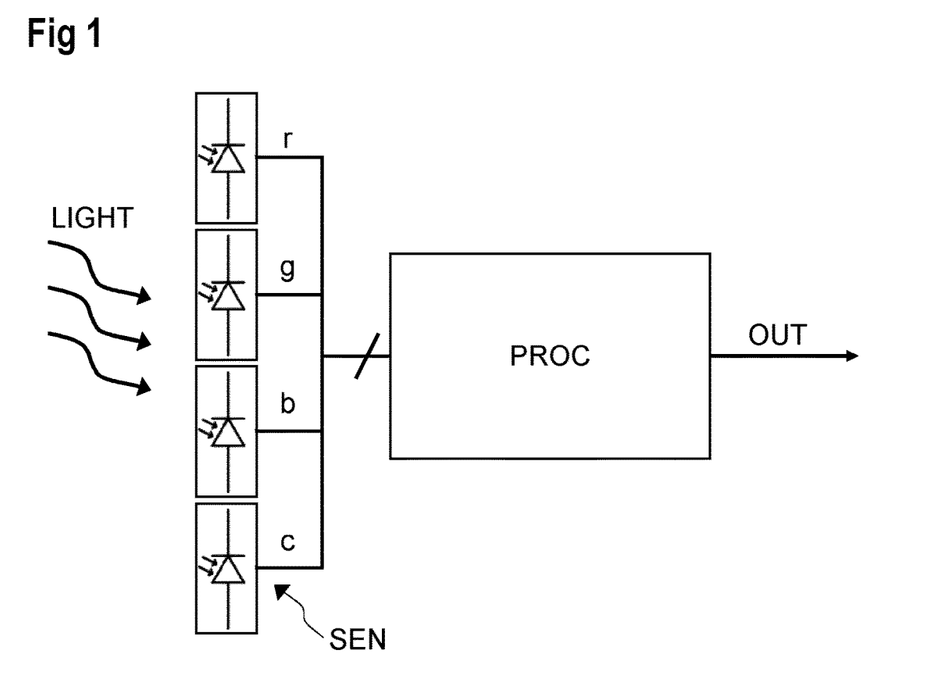
FIG. 1 shows an embodiment of a light sensor system.

FIG. 1 shows an exemplary embodiment of a light sensor system with sensors SEN in a processing unit PROC. The sensor SEN comprises four photodiodes, to which light is provided and which are adapted to sense red light, green light, blue light and a full spectrum light in order to generate respective signals r, g, b, c provided to the processing unit PROC. The signals r, g, b, c are processed by the processing unit PROC in order to provide various output signals at an output OUT.

The sensor SEN may comprise other types of light sensors instead of the shown photodiodes. The signals r, g, b, c may be used directly by the processing unit PROC as color channel signals or are processed, for example analog-to-digital converted, to respective color channel signals, namely a red channel signal R, a green channel signal G, a blue channel signal B and a clear channel signal C.

In the embodiment of FIG. 1, one possible combination of colors and color sensors is used. However, the red, green, blue color signals could be replaced by other color signals, like cyan, magenta, yellow, in different embodiments. In particular, the following explanations and possible processing of the color signals are demonstrated for the red, green, blue color signals, but could be demonstrated for cyan, magenta, yellow color signals as well.

Figure 2:
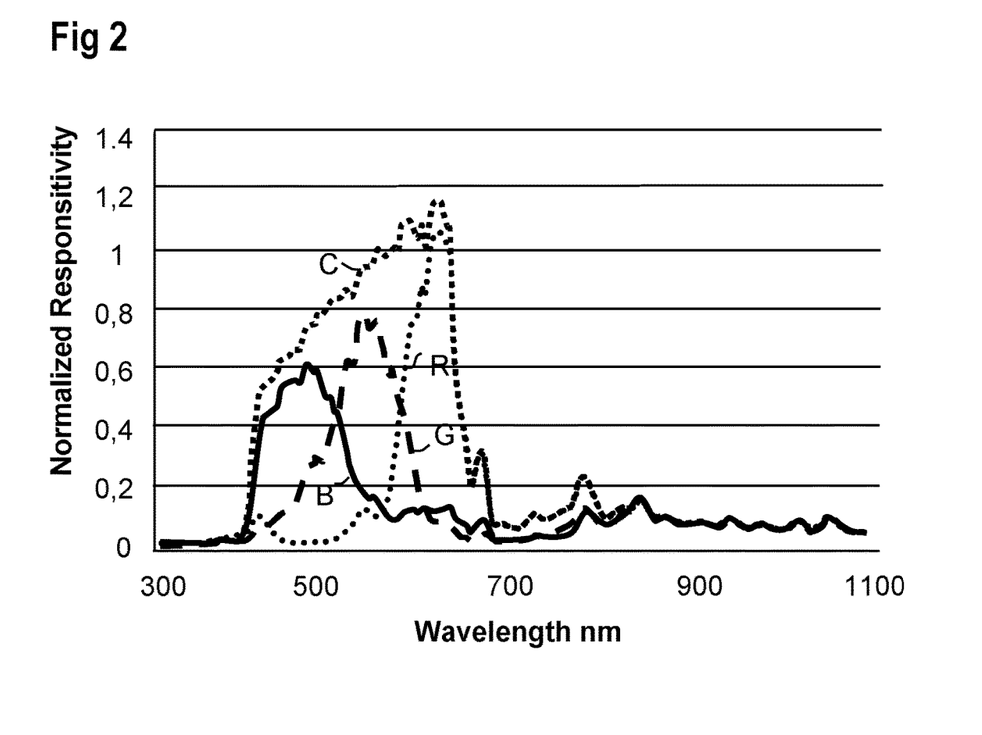
FIG. 2 shows a spectral diagram of light signals.

FIG. 2 shows an exemplary spectral diagram with spectral responses of light sensors resulting in the red channel signal R, the green channel signal G, the blue channel signal B and the clear channel signal C. As the light falling onto the sensor SEN contains infrared components, the channel signals shown in FIG. 2 are influenced by the infrared components.

For example, the processing circuit PROC is configured to calculate an infrared component IR of light from three color signals from the light sensors, and the clear channel signal C corresponding to a full spectrum light. The calculated IR component may be used to improve the signal accuracy of the color channel signals and the clear channel signal.

For example, the processing circuit PROC is configured to calculate the infrared component IR according to the formula of equation (1). The weighting factors C1, C2, C3 and C4 may all be set to 0.5. However, the weighting factors may be chosen to differ from 0.5, each in a specified range such as from 0.4 to 0.6. The exact values of the weighting factors C1, C2, C3 and C4 may be determined in a calibration process after fabrication or implementation of the light sensor system. However, choosing all of the weighting factors C1, C2, C3 and C4 being equal to 0.5 results in a simplified signal processing.

According to one embodiment, the processing circuit PROC is configured to generate a corrected red signal R', a corrected green signal G' and a corrected blue signal B' according to the formulas $$R'=R-IR,$$

$$G'=G-IR,$$

$$B'=B-IR. \quad (2)$$

The processing circuit PROC may be configured to output the corrected color signals to an external circuit. Further to the corrected color signals, also a corrected clear channel signal C' can be generated and optionally output according to $$C'=C-IR. \quad (3)$$

The corrected color signals and the optional corrected clear channel signal are hence independent or basically independent of actual lighting conditions or a light source generating the light sensed by the light sensors. As a consequence, the corrected color signals present an improved accuracy, particularly in comparison to the original color channel signals.

Figure 3:
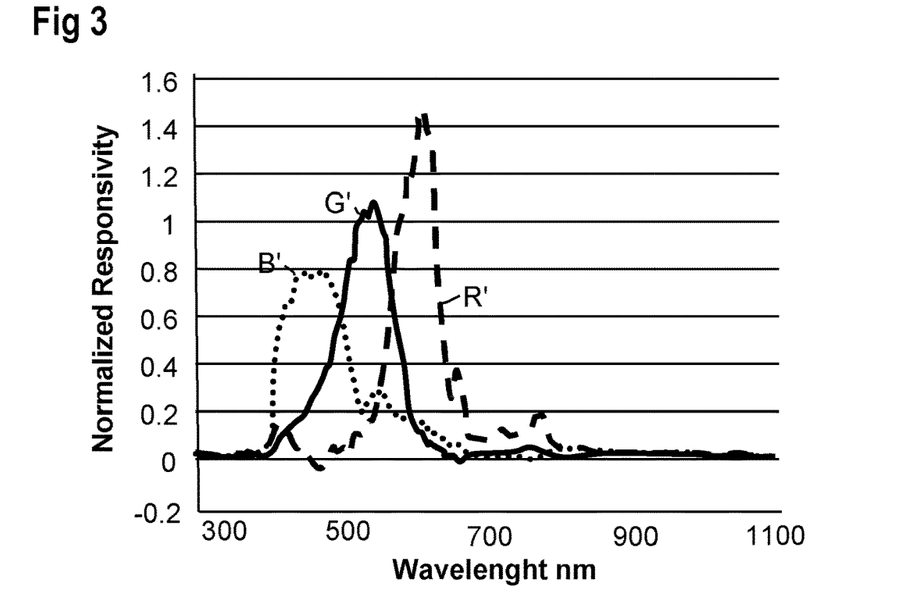
FIG. 3 shows a further spectral diagram of light signals.

The spectral diagram of FIG. 3 shows spectral responses of the resulting corrected color signals R', G' and B'.

In a further embodiment, the processing circuit PROC is configured to generate an equalized red signal R", an equalized green signal G" and an equalized blue signal B" according to the formula:

$$\begin{bmatrix} R'' \\ G'' \\ B'' \end{bmatrix} = \underline{E} \cdot \begin{bmatrix} R' \\ G' \\ B' \end{bmatrix}, \quad (4)$$

where $\underline{E}$ is a 3×3 coefficient matrix.

By the matrix multiplication of equation (4), signal levels of the single color channels are adapted to each other. Preferably, the coefficients of the matrix $\underline{E}$ are chosen such that the equalized green signal G" matches the photopic luminosity function, which is well-known in the art and corresponds to the vision of the human eye under well-lit conditions.

For example, the coefficients of the matrix $\underline{E}$ are chosen such that $$R''=E11 \cdot R', \quad (5)$$

wherein E11 is a positive weighting factor.

In one specific embodiment, the matrix $\underline{E}$ is defined by $$E = \cdot \begin{bmatrix} 0.9 & 0 & 0 \\ 0.1 & 1 & -0.2 \\ -0.15 & -0.2 & 1.35 \end{bmatrix},$$

such that $$R''=R' \cdot 0.9$$

$$G''=R' \cdot 0.10+G'-B' \cdot 0.2$$

$$B''=-R' \cdot 0.15-G' \cdot 0.2+B' \cdot 1.35 \quad (6)$$

Regarding the generation of the equalized color signals, it should be noted that the equalizing process does not convert the color signals to a CIE color space.

Figure 4:
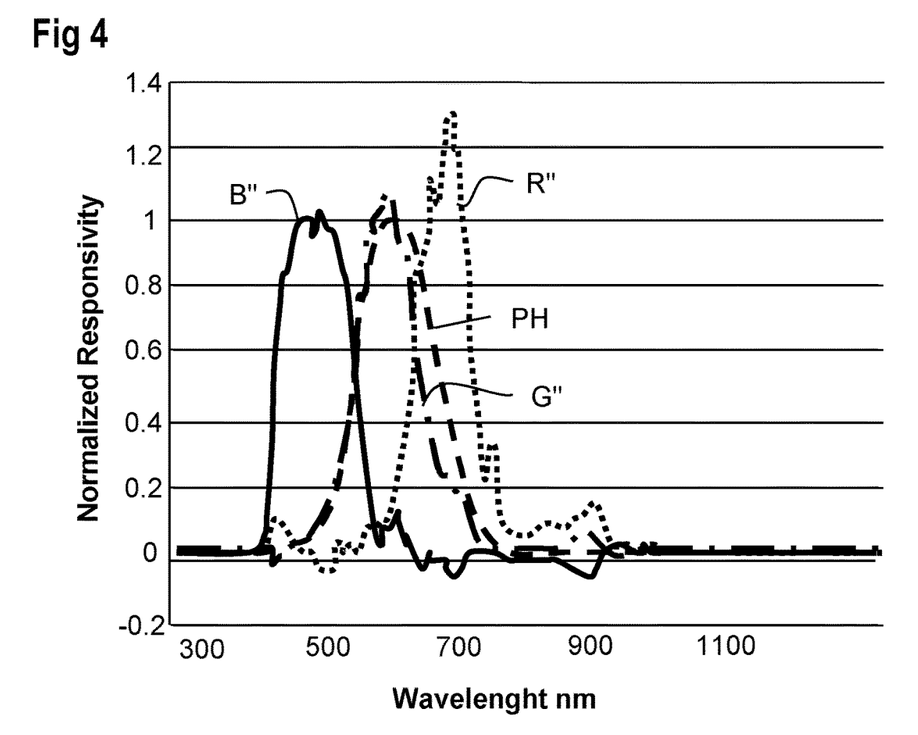
FIG. 4 shows a further spectral diagram of light signals.

FIG. 4 shows the resulting equalized color signals R", G", B" and furthermore the spectral function of the photopic luminosity function PH. As can be seen from FIG. 4, the equalization is performed such that particularly the equalized green signal G" is matched to the photopic function PH.

Figure 5:
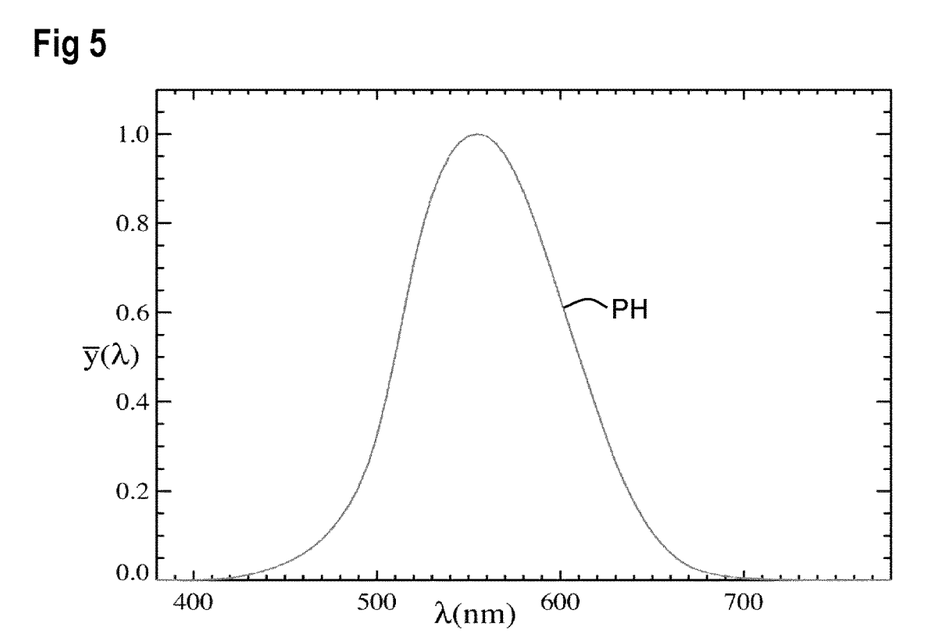
FIG. 5 shows a spectral diagram of the photopic luminosity function.

For a better overview, FIG. 5 shows the spectral response of the photopic luminosity function PH in a single spectral diagram. It should be noted that the photopic luminosity function is not part of the invention, but relates to the scientific term of photopic vision for human color vision under normal lighting conditions during the day.

The corrected color signals or the equalized color signals, which do not contain the infrared component IR, can be used to generate an illuminance value LUX, which can be one of the signals output by the processing circuit PROC or the light sensor system, respectively. For example, G' or G" are directly related to the illuminance LUX by a factor that is a function in integration time and gain. For example, the processing circuit PROC is configured to generate the illuminance value LUX based on the corrected green signal G' according to the formula $$LUX=LF \cdot G', \quad (7a)$$

or based on the equalized green signal G" according to the formula $$LUX=LF \cdot G'', \quad (7b)$$

wherein LF is a positive weighting factor, respectively. For example, the weighting factor LF is determined according to $$LF=DF/(ATIME \cdot AGAIN), \quad (8)$$

with DF being a system factor, ATIME being an integration time factor, and AGAIN being a gain correction factor. The integration time factor ATIME depends on processing values of the processing circuit PROC, for example, wherein the gain correction factor AGAIN depends on electrical characteristics of the light sensor system. The system factor DF may be determined as a fixed value by empirical tests during production or by a calibration routine after implementation of the light sensor system.

If the equalized color signals R", B" are not used for further processing, it is sufficient to only calculate the equalized green signal G", which then can be used in equation (7b). Accordingly, in one embodiment, the processing circuit PROC is configured to generate the equalized green signal G" according to the formula:

$$G'' = [E_{21}\ E_{22}\ E_{23}] \cdot \begin{bmatrix} R' \\ G' \\ B' \end{bmatrix}, \quad (4b)$$

where $E_{21}$, $E_{22}$ and $E_{23}$ are respective coefficients of a 1×3 matrix $\underline{E}$. In other words, only the G" part of the 3×3 matrix $\underline{E}$ of equation (4) is calculated. Preferably, the coefficients $E_{21}$, $E_{22}$ and $E_{23}$ are chosen such that the equalized green signal G" matches the photopic luminosity function.

In further embodiments, the processing circuit PROC is configured to generate a color temperature value CT based on at least two of the corrected color signals R', G', B" or based on at least two of the equalized color signals R", G", B". The color temperature refers to a color of piece of metal with glow when heated to a temperature, and it typically stated in terms of degree Kelvin. The color temperature goes from red at lower temperatures to blue at higher temperatures. For example, the color temperature CT can be calculated depending on the ratio of blue to red light using an empirical formula. In particular, it has been found by the applicants that there is a linear dependency between the color temperature CT and the blue to red ratio.

Especially for the calculation of the color temperature CT, it is desirable to use the corrected color signals or the equalized color signals in order to get rid of the influences of the infrared component IR. Accordingly, the processing circuit PROC may be configured to generate the color temperature value CT according to the formula $$CT = CT\_OFFSET + CT\_COEFF \cdot \frac{B'}{R'}, \quad (9a)$$

or $$CT = CT\_OFFSET + CT\_COEFF \cdot \frac{B''}{R''}, \quad (9b)$$

where CT_OFFSET is a positive offset value and CT_COEFF is a positive weighting factor.

The values of CT_OFFSET and CT_COEFF may be determined by numerical methods using defined input signals and output signals. For example, a linear regression may be used to determine the values of CT_OFFSET and CT_COEFF based on experimental data using several light sources.

As mentioned before, some of the calculations, in particular the coefficients of such calculations, are best valid if the light sensed by the light sensors is equally distributed over the frequency spectrum and can therefore be regarded as white light. If the portion of a single color channel increases with respect to the other channels, the overall color of the sensed light becomes saturated, which results in the illuminance value LUX and the color temperature value CT becoming slightly inaccurate. However, to prevent inaccurate results, it can be determined when this happens. For example, a calculation of color saturation can be used to determine this condition and, if such a saturation condition is determined, the color temperature results can be ignored or another method of calculation may be utilized. The determination of the grade of saturation can be based on the channel signals R, G, B, C directly or from the corrected or equalized color signals.

According to one implementation form, the colors are first normalized according to $$Rn = R''/(R''+G''+B''),$$

$$Gn = G''/(R''+G''+B''),$$

$$Bn = B''/(R''+G''+B''). \quad (10)$$

By determining a maximum value MX and the minimum value mn, the saturation SAT can be calculated according to $$MX = \max(Rn, Gn, Bn),$$

$$mn = \min(Rn, Gn, Bn),$$

$$SAT = (MX - mn)/MX. \quad (11)$$

For white light, R"~G"~B" and (MX−mn) is small and (MX−mn)/MX is smaller. For saturated light, (Mx−mn) is large and, e.g., if (MX−mn)/MX>0.75, the light source is starting to saturate.

In the saturated condition, the color temperature value CT may become uncertain if calculated according to the above equations (9a) or (9b). Hence, a different calculation for the color temperature can be used.

As described above, equation (1) provides a value for the infrared component IR. This value IR can be used to estimate the amount of infrared light in the light source. From this data it can be determined if the light source is e.g. incandescent light, sunlight or fluorescent light. The amount of infrared components in the light source may be expressed as the ratio between the infrared component IR and the clear channel signal C or the corrected clear channel signal C', respectively. For example, for fluorescent light, it is known that the ratio IR/C is in the order of 0.01, for sunlight it is in the order of 0.15, and for incandescent light it is about 0.35.

Accordingly, the processing circuit PROC may be configured to determine a type of light source based on the infrared component and at least one of the channel signals R, G, B, C or its derivatives, for example R', G', B', C'.

As mentioned above, the color channel signals may not only represent red, green, blue but also cyan, magenta, yellow, instead. If respective light sensors for sensing cyan colored light, magenta colored light, yellow colored light and a full spectrum light are used, the above equations may be adapted to the corresponding cyan channel signal, CY, magenta channel signal M, yellow channel signal Y and the clear channel signal C. For example, similar to equation (1), the infrared component IR can be calculated according to the formula $$IR = C1 \cdot CY + C2 \cdot M + C3 \cdot Y - C4 \cdot C, \quad (12)$$

where C1, C2, C3 and C4 are positive weighting factors.

Similarly, also equations (2) to (11) can be adapted to incorporate the new color channels according to equation (12).

For example, following formulas result:

$$CY' = CY - IR, \quad (13)$$

$$M' = M - IR,$$

$$Y' = Y - IR,$$

$$M'' = E \cdot \begin{bmatrix} CY' \\ M' \\ Y' \end{bmatrix}. \quad (14)$$

and $$\begin{bmatrix} CY'' \\ M'' \\ Y'' \end{bmatrix} = \underline{E} \cdot \begin{bmatrix} CY' \\ M' \\ Y' \end{bmatrix}. \quad (15)$$

For instance, coefficients of the matrix $\underline{E}$ are chosen such that the equalized magenta signal M" matches the photopic luminosity function. The LUX value as discussed above may be calculated from M' or preferably from M".

Further exactly adapted formulas are omitted here to enable a better overview but become apparent to the skilled reader.

Figure 6:
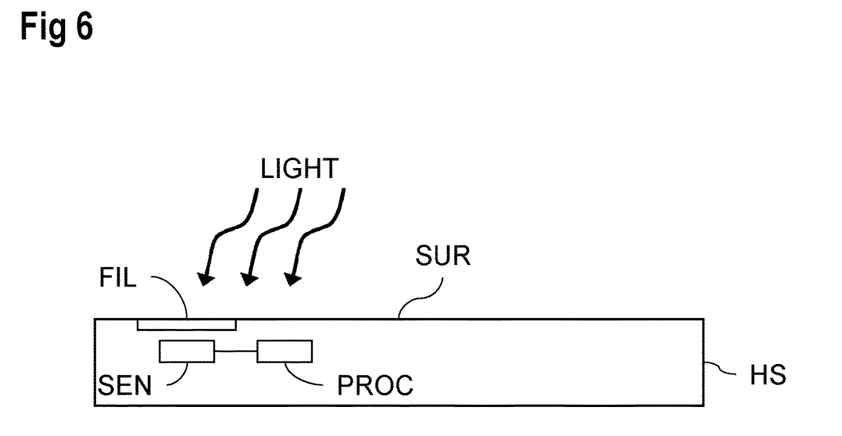
FIG. 6 shows an exemplary application of a light sensor system.

FIG. 6 shows an exemplary application for a light sensor system as shown above. For example, the light sensor system with the sensor SEN and the processing unit PROC is arranged in a housing HS, which could be the housing of a mobile device like a mobile phone, an e-book reader, a handheld computer with a touch screen or the like. The housing HS has a surface SUR, which may be made of glass or any other transparent material. Above the sensor SEN a filter FIL is arranged, which may be adapted to block specific wavelengths of incoming light. However, the filter FIL may also be a plate or the like, which is configured to hide the light sensor system, in particular the sensor from being viewed through the surface by a user. For example, the filter FIL is prepared with dark glass or a dark ink on the glass. Typically, this would allow more blue light and infrared light to be transmitted to the sensor SEN while attenuating the green and red light. As a consequence, the spectrum is shifted, such that the values for the coefficients in the above equations may be adapted to the transmission characteristic of the dark glass or ink on glass. For example, this can be done during a calibration process after producing or implementing the light sensor system. However, if the coefficients for the above equations are once determined for a specific dark glass or filter in general, these coefficients may be taken unchanged afterwards.

Figure 7:
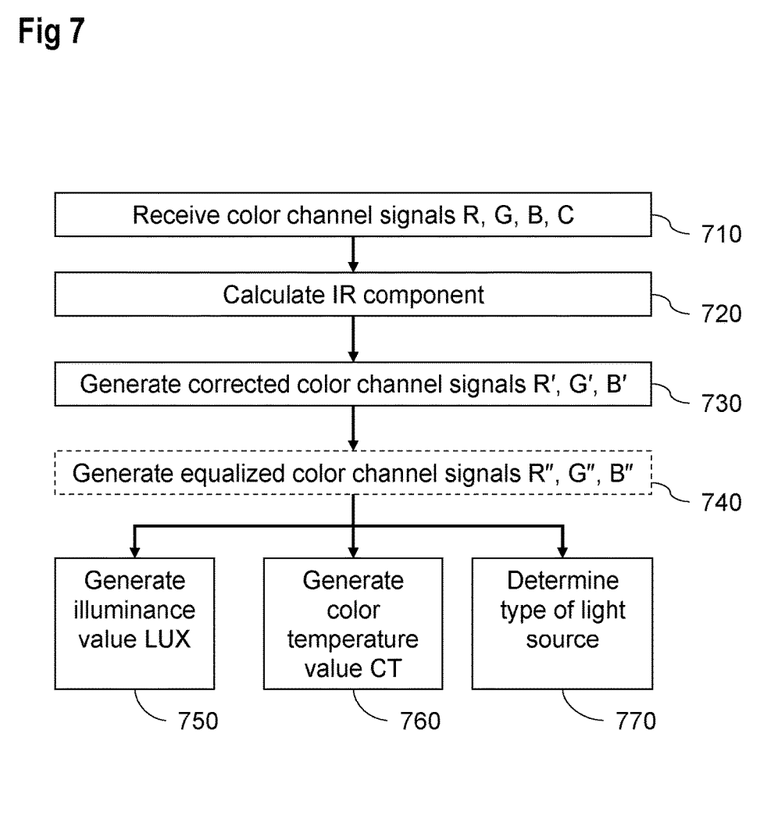
FIG. 7 shows a block diagram of an embodiment of a method for processing light sensor signals.

FIG. 7 shows an exemplary block diagram of an embodiment of a method for processing light sensor signals. In block 710 color channel signals R, G, B, C for the red channel, the green channel, the blue channel and the clear channel corresponding to red light, green light, blue light and the full spectrum light, respectively. These color channel signals R, G, B, C are used as raw data for further processing.

Accordingly, in block 720 an infrared component IR is calculated based on the color channel signals, in particular according to equation (1) with respective weighting factors C1, C2, C3 and C4.

In the following block 730, which is an optional block, corrected color channel signals R', G', B' and optionally C' are generated by subtracting the infrared component IR according to equations (2) and (3). As the influence of the infrared component IR is reduced in the corrected color channel signals, the accuracy of the single channel values of the red channel, green channel and blue channel is increased.

In the following block 740, which is also an optional block, equalized color channel signals R", G", B" are calculated from the corrected color signals, for example according to equations (4) to (6).

The corrected color channel signals R', G', B', C' and/or the equalized color channel signals R", G", B" can be used for further processing in optional blocks 750, 760, 770. For example, in block 750 an illuminance value LUX is generated from the color signals, for example, according to equations (7a), (7b) in conjunction with equation (8) and based on the result of equation (4) or (4b) as described above.

Furthermore, in block 760 a color temperature value CT can be generated based on at least two of the corrected color signals R', G', B' or based on at least two of the equalized color signals R", G", B". For example, calculation according to equations (9a) or (9b) can be used to generate the color temperature value CT.

Additionally, in block 770, the type of light source of the incoming light is determined. For example, the type of light source is determined based on the infrared component IR and at least one of the channel signals R, G, B, C or its corrected or equalized derivatives.

The accuracy of the above calculations can be supervised by determining the color saturation of the incoming light, which can be determined based on the channel signals R, G, B, C or its corrected or equalized derivatives, for example according to equations (10) and (11).

The various methods and equations described above in conjunction with their application in a light sensor system allow for more accurate results from light sensors, in particular if used in ambient light sensing. It should be noted that the provision of each calculation result is optional and dependent on the specific implementation of the method or the light sensor system. Accordingly, the various embodiments can be combined or taken separately and therefore be adapted to specific implementations in an efficient way.

The invention claimed is:

1. A light sensor system, comprising:
   light sensors to sense red light, green light, and blue light in order to generate a red channel signal R from the sensed red light, a green channel signal G from the sensed green light, and a blue channel signal B from the sensed blue light;
   a clear channel signal sensor to sense full spectrum light in order to generate a clear channel signal C that includes or corresponds to the sensed full spectrum light; and
   a processing circuit, which is configured to perform the following steps during operation of the light sensor system:
   calculate an infrared component IR according to the formula $IR = C1 \cdot R + C2 \cdot G + C3 \cdot B - C4 \cdot C,$ where C1, C2, C3 and C4 are positive weighting factors;
   generate a corrected red signal R', a corrected green signal G' and a corrected blue signal B' according to the formulas:

$R' = R - IR,$ $G' = G - IR,$ $B' = B - IR;$ and generate an equalized green signal G" according to the formula:

$$G'' = E \cdot \begin{bmatrix} R' \\ G' \\ B' \end{bmatrix},$$

where E is a 1×3 coefficient matrix,
   wherein the light sensor system is configured to output the equalized green signal G" as an output signal, and
   wherein light sensors to sense the red, green and blue light and the clear channel signal sensor are connected in parallel to the processing circuit.

2. The light sensor system according to claim 1, wherein the processing circuit is further configured to generate an equalized red signal R", the equalized green signal G" and an equalized blue signal B" according to the formula:

$$\begin{bmatrix} R'' \\ G'' \\ B'' \end{bmatrix} = E \cdot \begin{bmatrix} R' \\ G' \\ B' \end{bmatrix},$$

where E is a 3×3 coefficient matrix, and
wherein the light sensor system is configured to output the equalized red signal R" and the equalized blue signal B" as further output signals.

3. The light sensor system according to claim 2, wherein coefficients of the matrix E are chosen such that R"=E11·R', E11 being a positive weighting factor.

4. The light sensor system according to claim 1, wherein coefficients of the matrix E are chosen such that the equalized green signal G" matches the photopic luminosity function.

5. The light sensor system according to claim 1, wherein the processing circuit is configured to determine a type of light source based on the infrared component IR and at least one of the channel signals R, G, B, C or at least one of the corrected signals R', G', B', C', wherein C'=C−IR.

6. The light sensor system according to claim 1, wherein the processing circuit is configured to determine a color saturation based on the channel signals R, G, B, C and to provide respective output signals based on the determined color saturation.

7. A light sensor system, comprising:
light sensors to sense cyan colored light, magenta colored light, and yellow colored light in order to generate a cyan channel signal CY from the sensed cyan colored light, a magenta channel signal M from the sensed magenta colored light, and a yellow channel signal Y from the sensed yellow colored light;
a clear channel signal sensor to sense full spectrum light in order to generate a clear channel signal C that includes or corresponds to the sensed full spectrum light; and
a processing circuit, which is configured to perform the following steps during operation of the light sensor system:
calculate an infrared component IR according to the formula $IR = C1 \cdot CY + C2 \cdot M + C3 \cdot Y - C4 \cdot C,$ where C1, C2, C3 and C4 are positive weighting factors;

generate a corrected cyan signal CY', a corrected magenta signal M' and a corrected yellow signal Y' according to the formulas:

$CY' = CY - IR,$ $M' = M - IR,$ $Y' = Y - IR;$ and generate an equalized magenta signal M" according to the formula:

$$M'' = \underline{E} \cdot \begin{bmatrix} CY' \\ M' \\ Y' \end{bmatrix},$$

where E is a 1×3 coefficient matrix,
wherein the light sensor system is configured to output the equalized magenta signal M" as an output signal, and
wherein light sensors to sense the cyan, magenta and yellow light and the clear channel signal sensor are connected in parallel to the processing circuit.

8. The light sensor system according to claim 7, wherein the processing circuit is further configured to generate an equalized cyan signal CY", the equalized magenta signal M" and an equalized yellow signal Y" according to the formula:

$$\begin{bmatrix} CY'' \\ M'' \\ Y'' \end{bmatrix} = \underline{E} \cdot \begin{bmatrix} CY' \\ M' \\ Y' \end{bmatrix},$$

where E is a 3×3 coefficient matrix, and
wherein the light sensor system is configured to output the equalized cyan signal CY" and the equalized yellow signal Y" as further output signals.

9. The light sensor system according to claim 7, wherein coefficients of the matrix E are chosen such that the equalized magenta signal M" matches the photopic luminosity function.

* * * * *

UNITED STATES PATENT AND TRADEMARK OFFICE
CERTIFICATE OF CORRECTION

PATENT NO. : 10,393,577 B2
APPLICATION NO. : 14/423101
DATED : August 27, 2019
INVENTOR(S) : Kerry Glover, David Mehrl and Dan Jacobs Page 1 of 1

It is certified that error appears in the above-identified patent and that said Letters Patent is hereby corrected as shown below:

In the Claims

Column 8, Claim 1:
Line 51, delete "E" and insert -- $E$ --.

Column 9, Claim 2:
Line 1, delete "E" and insert -- $E$ --.

Column 9, Claim 3:
Line 6, delete "E" and insert -- $E$ --.

Column 9, Claim 4:
Line 9, delete "E" and insert -- $E$ --.

Column 10, Claim 7:
Line 17, delete "E" and insert -- $E$ --.

Column 10, Claim 8:
Line 34, delete "E" and insert -- $E$ --.

Column 10, Claim 9:
Line 39, delete "E" and insert -- $E$ --.

Signed and Sealed this
Fifth Day of November, 2019

Andrei Iancu
*Director of the United States Patent and Trademark Office*